(12) United States Patent
Han et al.

(10) Patent No.: US 8,940,621 B2
(45) Date of Patent: Jan. 27, 2015

(54) METHODS OF FORMING SEMICONDUCTOR MODULES INCLUDING FLEXIBLE PANELS

(75) Inventors: Sang-Uk Han, Hwaseong-si (KR);
Jeong-Kyu Ha, Hwaseong-si (KR);
Youngshin Kwon, Osan-si (KR); Seung Hwan Kim, Incheon (KR); KwanJai Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 344 days.

(21) Appl. No.: 13/531,983

(22) Filed: Jun. 25, 2012

(65) Prior Publication Data
US 2013/0005088 A1 Jan. 3, 2013

(30) Foreign Application Priority Data
Jun. 30, 2011 (KR) .................. 10-2011-0064612

(51) Int. Cl.
*H01L 21/00* (2006.01)
*H01L 21/56* (2006.01)
*H01L 23/00* (2006.01)
*H01L 21/683* (2006.01)

(52) U.S. Cl.
CPC .............. *H01L 21/56* (2013.01); *H01L 24/81* (2013.01); *H01L 21/6835* (2013.01); *H01L 21/561* (2013.01); *H01L 24/13* (2013.01); *H01L 2224/13144* (2013.01); *H01L 2224/13147* (2013.01); *H01L 2224/13155* (2013.01); *H01L 2224/81001* (2013.01); *H01L 2221/68327* (2013.01); *H01L 2221/68363* (2013.01); *H01L 2221/68381* (2013.01)
USPC .......................... 438/464; 438/33; 438/113

(58) Field of Classification Search
USPC ............................. 438/33, 68, 464
See application file for complete search history.

(56) References Cited

U.S. PATENT DOCUMENTS

| 7,642,175 B1 * | 1/2010 | Patwardhan et al. ......... 438/464 |
| 2005/0202595 A1 * | 9/2005 | Yonehara et al. ............ 438/110 |
| 2008/0013030 A1 | 1/2008 | Fujita |
| 2011/0159256 A1 * | 6/2011 | Arana et al. ................. 428/213 |
| 2012/0100697 A1 * | 4/2012 | Yasuda et al. ................ 438/464 |

FOREIGN PATENT DOCUMENTS

| JP | 2008-020836 | 1/2008 |
| JP | 2008-244492 | 10/2008 |
| JP | WO2011004657 | * 1/2011 |
| KR | 1020070032463 | 3/2007 |

* cited by examiner

*Primary Examiner* — James Mitchell
(74) *Attorney, Agent, or Firm* — F. Chau & Associates, LLC

(57) ABSTRACT

Provided are methods of forming semiconductor modules. The method includes forming a high polymer material layer having an adhesive property on a support substrate, adhering a semiconductor chip to the support substrate using the high polymer material layer, bonding the semiconductor chip adhered to the support substrate to a flexible panel, and removing the support substrate.

10 Claims, 9 Drawing Sheets

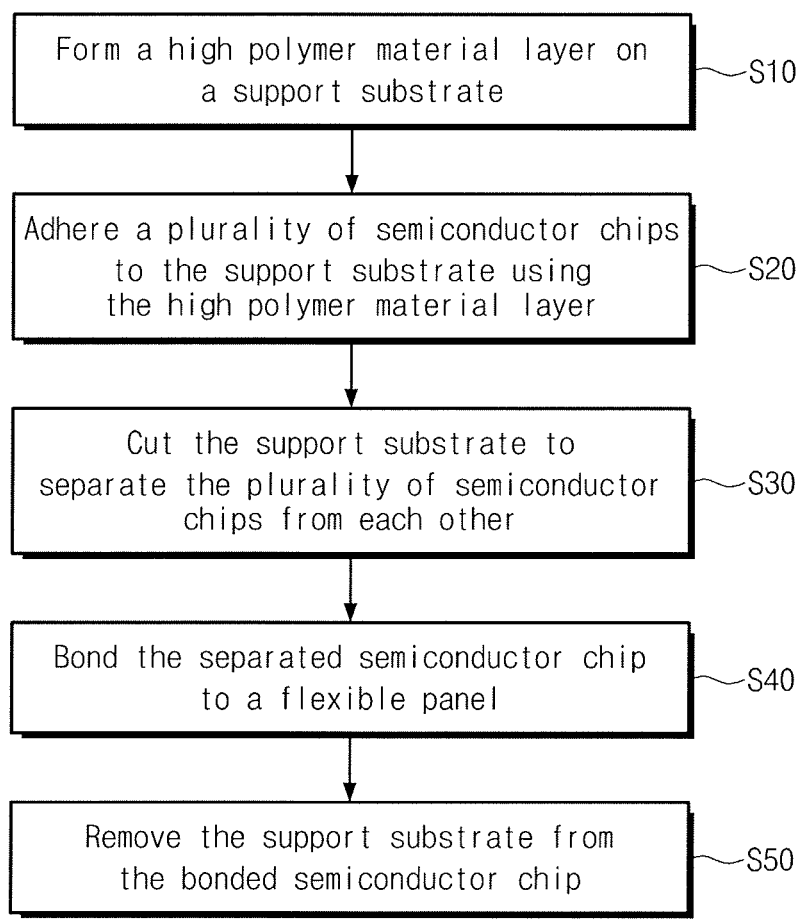

METHODS OF FORMING SEMICONDUCTOR MODULES INCLUDING FLEXIBLE PANELS

CROSS-REFERENCE TO RELATED APPLICATIONS

This U.S. patent application claims priority under 35 U.S.C. §119 to Korean Patent Application No. 10-2011-0064612, filed on Jun. 30, 2011, the disclosure of which is hereby incorporated by reference herein in its entirety.

BACKGROUND

The present disclosure herein relates to methods of forming semiconductor modules and to the semiconductor modules formed by the same and, more particularly, to methods of forming semiconductor modules including flexible panels and to the semiconductor modules formed by the same.

Recently, requirements for products which are lightweight, small in size, and which have low manufacturing costs have been increased in electronic products such as, for example, mobile phones and notebook computers. For instance, semiconductor modules used in electronic products and which are small in size, lightweight and which have low manufacturing costs may be required to satisfy the requirements of the electronic products.

Recently, various research has been conducted to realize semiconductor modules which are small in size, lightweight, and which have low manufacturing costs.

SUMMARY

Exemplary embodiments of the inventive concept may provide a method of forming a semiconductor module with increased reliability and a semiconductor module formed by the same.

Exemplary embodiments of the inventive concept may also provide a method of forming a semiconductor module capable of reducing manufacturing costs and a semiconductor module formed by the same.

Exemplary embodiments of the inventive concept may also provide a method of forming a semiconductor module optimized for being small in size and lightweight, and a semiconductor module formed by the same.

According to exemplary embodiments of the inventive concept, a method of forming a semiconductor module may include forming a high polymer material layer having an adhesive property on a support substrate, adhering a semiconductor chip to the support substrate using the high polymer material layer, bonding the semiconductor chip adhered to the support substrate to a flexible panel and removing the support substrate.

In an embodiment, a stress-resistance of the semiconductor chip may be no less than about 350 Mpa.

In an embodiment, adhering the semiconductor chip to the support substrate may include: adhering a plurality of semiconductor chips to the support substrate and cutting the support substrate and the high polymer material layer to separate the plurality of semiconductor chips from each other.

In an embodiment, adhering the plurality of semiconductor chips to the support substrate may include: adhering a wafer including the plurality of semiconductor chips and a scribe lane to the support substrate and dicing the scribe lane.

In an embodiment, removing the support substrate may include: performing an ultraviolet irradiation process and/or a thermal treatment process on the high polymer material layer.

In an embodiment, a hardness of the high polymer material layer may become less than a hardness of the flexible panel due to the ultraviolet irradiation process and/or thermal treatment process.

In an embodiment, the method may further include removing the high polymer material layer.

In an embodiment, the high polymer material layer and the support substrate may be removed simultaneously by the same process.

According to an exemplary embodiment of the inventive concepts, a semiconductor module may include: a flexible panel, a high polymer material layer disposed on the flexible panel, and including a material having an adhesive property, and a semiconductor chip disposed between the flexible panel and the high polymer material layer, and bonded to the flexible panel.

In an embodiment, a thickness of the semiconductor chip may have a range of about 30 µm to about 50 µm.

In an embodiment, the high polymer material layer may protect the semiconductor chip.

In an embodiment, a hardness of the high polymer material layer may be changed by an ultraviolet irradiation process and/or a thermal treatment process.

In an embodiment, the hardness of the high polymer material layer may be less than a hardness of the flexible panel.

In an embodiments, a stress-resistance of the semiconductor chip may be no less than about 350 Mpa.

In an embodiment, the flexible panel may include a thin film transistor.

In an embodiment, the flexible panel may further include an organic electro luminescent device electrically connected to the thin film transistor.

According to an exemplary embodiment of the inventive concept, a display apparatus is provided. The display apparatus includes a display unit including: a flexible panel and a semiconductor chip. The flexible panel includes a display region and a peripheral region disposed on a periphery of the display region. The flexible panel is composed of one of polycarbomate, polyimide, polyethylene terephthalate, polyester, or a combination thereof. The semiconductor chip has a first surface mounted on the peripheral region of the flexible panel, and the semiconductor chip has a stress-resistance value of no less than about 350 mpa, a deflection value of no less than about 0.15 nm and a thickness of about 30 µm to about 50 µm. In addition, the display apparatus further includes a container unit configured to contain the display unit therein.

BRIEF DESCRIPTION OF THE DRAWINGS

Exemplary embodiments of the inventive concept can be understood in more detail in view of the attached drawings and accompanying detailed description.

FIG. 1 is a flowchart illustrating a method of forming a semiconductor module according to an exemplary embodiment of the inventive concept;

DETAILED DESCRIPTION OF EXEMPLARY EMBODIMENTS

Figure 2A:
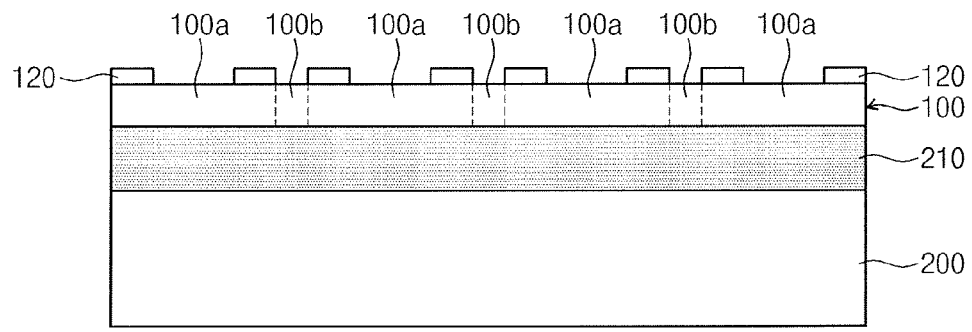
FIGS. 2A to 2D are cross sectional views illustrating a method of forming a semiconductor module according to an exemplary embodiment of the inventive concept.

Exemplary embodiments of the inventive concept will now be described more fully hereinafter with reference to the accompanying drawings, in which exemplary embodiments of the inventive concept are shown. Exemplary embodiments of the inventive concept can be understood in more detail from the following detailed description taken in conjunction with the accompanying drawings. It should be noted, however, that exemplary embodiments of the inventive concept are not limited to the following exemplary embodiments, and may be implemented in various forms. In the drawings, exemplary embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

A method of forming a semiconductor module according to an exemplary embodiment of the inventive concept will be described with reference to FIGS. 1 and 2A to 2D, hereinafter. FIG. 1 is a flowchart illustrating a method of forming a semiconductor module according to an exemplary embodiment of the inventive concept, and FIGS. 2A to 2D are cross sectional views illustrating a method of forming a semiconductor module according to an exemplary embodiment of the inventive concept.

Referring to FIGS. 1 and 2A, a wafer 100 may be adhered to a support substrate 200. The support substrate 200 may perform a function to support the wafer 100. As the support substrate 200 performs the function to support the wafer 100, a stress-resistance of the support substrate 200 may be greater than a stress-resistance of the wafer 100.

For example, a thickness of the support substrate 200 may be greater than that of the wafer 100. Or the support substrate 200 may be a substrate which has a little flexibility and/or a great stress-resistance. For example, the support substrate 200 may include a silicon substrate or a glass substrate.

According to an embodiment, the wafer 100 adhered to the substrate 200 may be a wafer to which a grinding process is performed. A plurality of semiconductor chips 100a may be formed in a bulk wafer, and then the grinding process may be performed to the bulk wafer, thereby forming the wafer 100. In an embodiment, a thickness of the wafer 100 may have a range of, for example, about 30 μm to about 50 μm.

The wafer 100 may include the plurality of semiconductor chips 100a. Each of the semiconductor chips 100a may include, for example, an integrated circuit. For example, the semiconductor chip 100a may include a drive integrated circuit. The wafer 100 may further include a scribe lane 100b disposed between the plurality of semiconductor chips 100a. The plurality of semiconductor chips 100a may be defined by the scribe lane 100b.

In an embodiment, each of the semiconductor chips 100a may further include, for example, a bump 120 which is electrically connected to the integrated circuit included in each of the semiconductor chips 100a. In an embodiment, the bump 120 may be provided in a plural number to each of the semiconductor chips 100a. Although not shown, when the bump 120 is provided in a plural number to each of the semiconductor chip 100a, the bumps 120 may be, for example, two-dimensionally arranged along rows and columns. The bump 120 may include, for example, metal. For example, the bump 120 may include copper, nickel, and/or gold.

Adhering the wafer 100 to the support substrate 200 may include, for example, forming a high polymer material layer 210 on the support substrate 200 (S10), and adhering the wafer 100 to the support substrate 200 using the high polymer material layer 210 (S20). The high polymer material layer 210 may include a material having an adhesive property. For example, the high polymer material layer 210 may include one of an epoxy adhesive, an acrylic adhesive, a polyimide adhesive, silicon adhesive or combination thereof. In an embodiment, after the high polymer material layer 210 is applied to the support substrate 200 and then the wafer 100 is provided on the high polymer material layer 210, the high polymer material layer 210 may be, for example, hardened to adhere the wafer 100 to the support substrate 200. For example, the high polymer material layer 210 may be hardened by a thermal treatment process, an ultraviolet irradiation process, and/or a microwave treatment process. Alternatively, for example, a physical force may be applied to the wafer 100 and/or the support substrate 200 to adhere the wafer 100 to the support substrate 200.

Figure 2B:
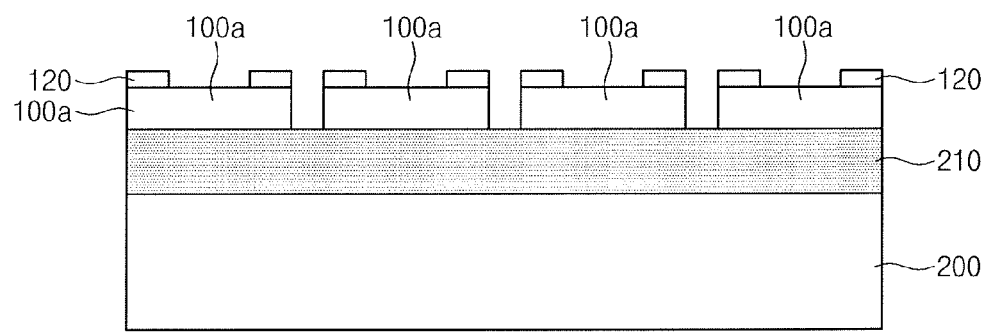

Referring to FIG. 2B, the plurality of semiconductor chips 100a in the wafer 100 may be separated from each other by performing, for example, a dicing process on the wafer 100. The dicing process may, for example, cut the scribe lane 100b, so that the plurality of semiconductor chips 100a may be separated from each other and be adhered to the support substrate 200.

Alternatively, for example, contrary to the method described with reference to FIGS. 2A and 2B, after the wafer 100 is diced to separate the plurality of semiconductor chips 100a, the separated semiconductor chips 100a may be adhered to the support substrate 200. That is, the high polymer material layer 210 may be formed on the support substrate 200, and the separated semiconductor chips 100a may be adhered to the support substrate 200 using the high polymer material layer 210. In an embodiment, the plurality of semiconductor chips 110a, which are separated from each other and adhered to the support substrate 200, may have different integrated circuits from each other.

Figure 2C:
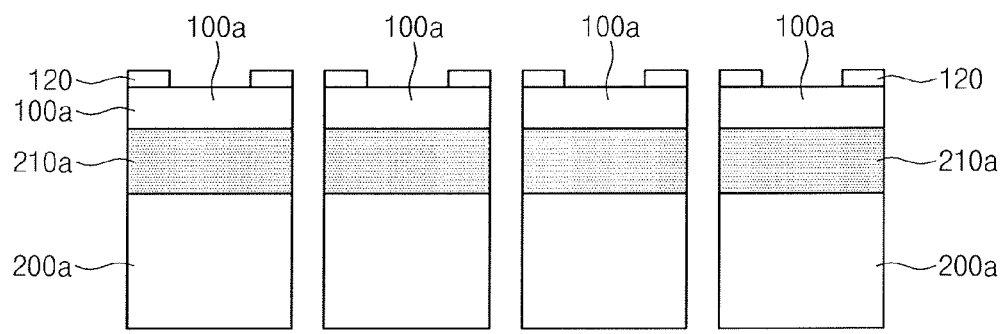

Referring to FIGS. 1 and 2C, the high polymer material layer 210 and the support substrate 200 may be cut (S30). The high polymer material layer 210 and the support substrate 200 may be cut to form, for example, high polymer material patterns 210a and support patterns 200a. The high polymer material patterns 210a and the support patterns 200 may be separated from each other by the cutting process (S30), so that the plurality of semiconductor chips 100a adhered to the support substrate 200 may be separated from each other. That is, each of the high polymer material patterns 210a and each of the support patterns 200a may perform a function to support each of the semiconductor chips 100a.

In an embodiment, the dicing process to the wafer 100 described with reference to FIG. 2B may be performed, for example, simultaneously with the cutting process of the high polymer material layer 210 and the support substrate 200 described with reference to FIG. 2C. That is, the high polymer material layer 210 and the support substrate 200 as well as the wafer 100 may be cut simultaneously along the scribe lane 100b of the wafer 100.

Figure 2D:
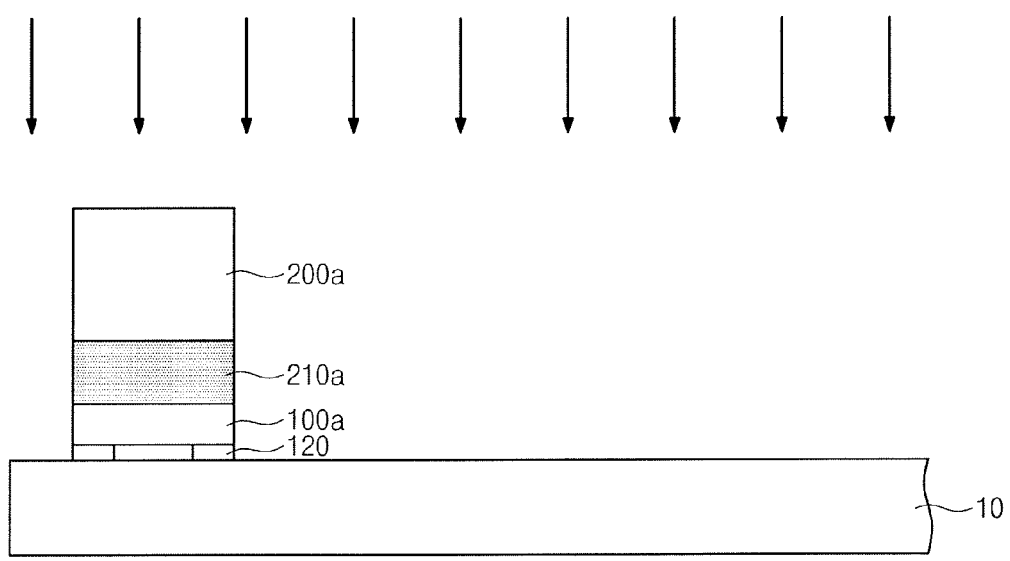

Referring to FIGS. 1 and 2D, a single semiconductor chip 100a supported by the high polymer material pattern 210a and the support pattern 200a may be bonded to a flexible panel 10 (S40). The flexible panel 10 may have, for example, better flexibility than a silicon substrate or a glass substrate having the same thickness as the flexible panel 10. According to an embodiment, the flexible panel 10 may be, for example, a plastic substrate. For example, the flexible panel 10 may include one of polycarbomate (PC), polyimide (PI), polyethylene terephthalate (PET), polyester (PES), or a combination thereof.

In an embodiment, the single semiconductor chip 100a bonded to the flexible panel 10 may have a stress-resistance value of, for example, no less than about 350 Mpa (megapascal). Also, the single semiconductor chip 100a bonded to the flexible panel 10 may have a deflection value of, for example, no less than about 0.15 mm. A thickness of the single semiconductor chip 100a may have a range of, for example, about 30 µm to about 50 µm.

As the high polymer material pattern 210a and the support pattern 200a may support the semiconductor chip 100a, damage to the semiconductor chip 100a may be minimized during the bonding process of the semiconductor chip 100a to the flexible panel 10.

Although not shown, the flexible panel 10 may include an electronic circuit. In this case, the electronic circuit of the flexible panel 10 may be electrically connected to the integrated circuit of the semiconductor chip 100a through the bump 120 by the bonding process.

Referring to FIG. 1, the support pattern 200a may be removed from the semiconductor chip 100a (S50). In an embodiment, the process of removing the support pattern 200a (S50) may include, for example, a process of softening the high polymer material pattern 210a. For example, an ultraviolet irradiation process and/or a thermal treatment process may be performed on the high polymer material pattern 210a to soften the high polymer material pattern 210a. When the high polymer material pattern 210a is softened, an adhesive force of the high polymer material pattern 210a may become weak thereby facilitating the removal of the support pattern 200a.

Figure 3A:
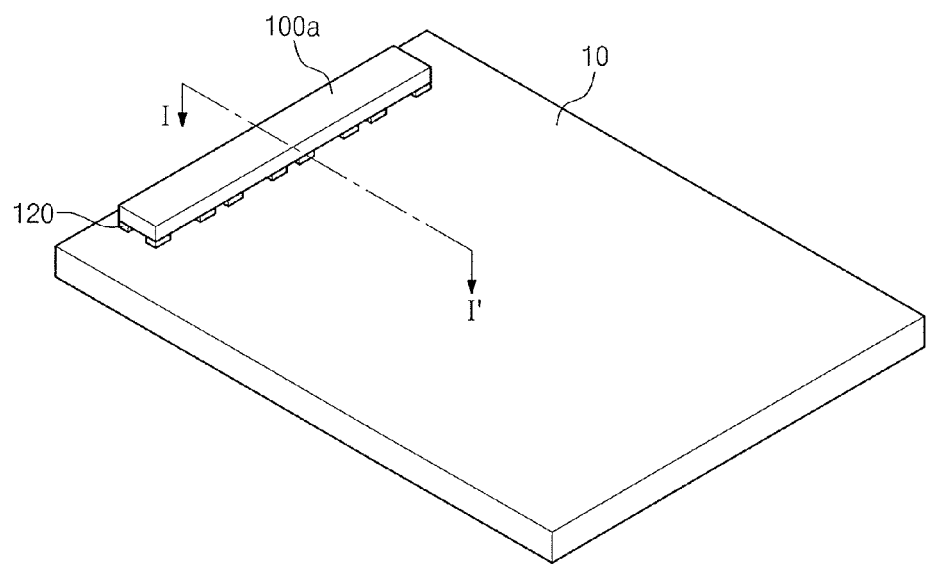
FIG. 3A is a perspective view illustrating a semiconductor module according to an exemplary embodiment of the inventive concept.
Figure 3B:
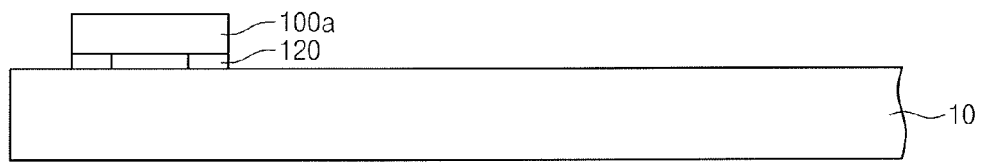
FIG. 3B is a cross sectional view taken along a line I-I' of FIG. 3A to illustrate a semiconductor module according to an exemplary embodiment of the inventive concept.

In an embodiment, as illustrated in FIGS. 3A and 3B, the high polymer material pattern 210a may also be removed. After the support pattern 200a is removed, a cleaning process may be performed to remove the high polymer material pattern 210a. Alternatively, the support pattern 200a and the high polymer material pattern 210a may be removed simultaneously.

Figure 4A:
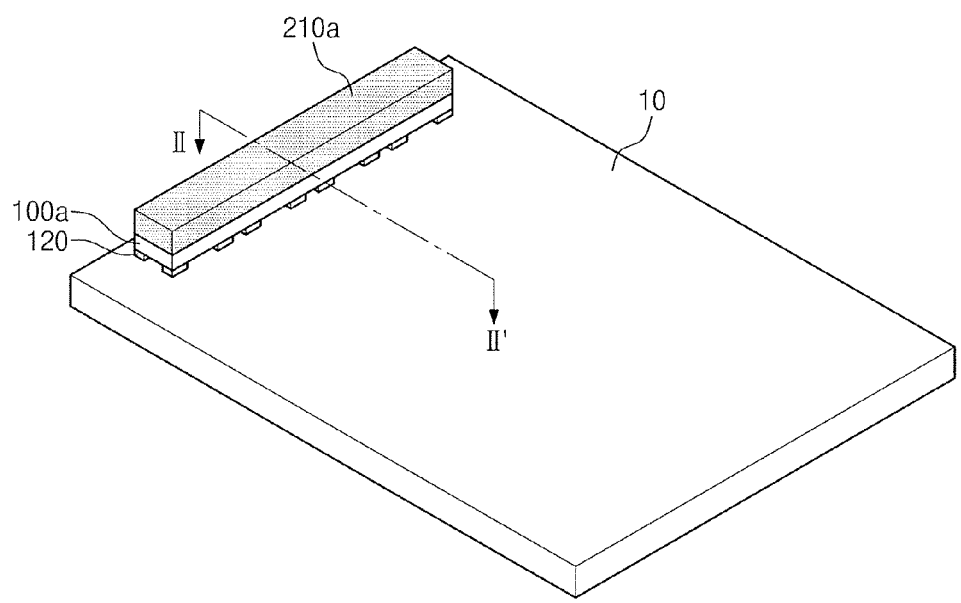
FIG. 4A is a perspective view illustrating a semiconductor module according to an exemplary embodiment of the inventive concept.
Figure 4B:
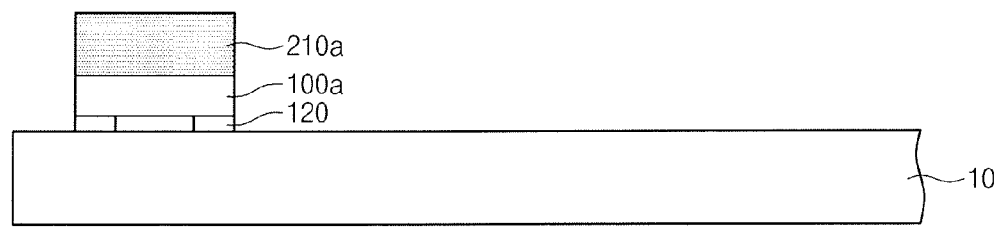
FIG. 4B is a cross section view taken along a line II-II' of FIG. 4A to illustrate a semiconductor module according to an exemplary embodiment of the inventive concept.

In an embodiment, as illustrated in FIGS. 4A and 4B, the high polymer material pattern 210a may remain on the semiconductor chip 100a while the support pattern 200a is removed. When the high polymer material pattern 210a remains on the semiconductor chip 100a, the high polymer material pattern 210a may protect the semiconductor chip 100a to minimize damage to the semiconductor chip 100a which may be caused by an external force and/or permeation of an external material.

According to an embodiment of the inventive concept, the semiconductor chip 100a may be adhered to the support substrate 200 using the high polymer material layer 210, and then the semiconductor chip 100 adhered to the support substrate 200 may be bonded to the flexible panel 10. Thus, damage to the semiconductor chip 100a which may be caused by bonding the semiconductor chip 100a to the flexible panel 10 may be minimized. As a result, a semiconductor module with increased reliability may be realized.

Also, according to an embodiment, the semiconductor chip 100a may be, for example, bonded directly to the flexible panel 10. That is, another structure for connection of the semiconductor chip 100a and the flexible panel 10 may be omitted. Thus, a semiconductor module optimized for being small in size and/or lightweight may be realized, and/or a semiconductor module may be formed with low manufacturing costs.

Semiconductor modules according to an embodiment of the inventive concept will described with reference to FIGS. 3A, 3B, 4A and 4B, hereinafter. FIG. 3A is a perspective view illustrating a semiconductor module according to an exemplary embodiment of the inventive concept, and FIG. 3B is a cross sectional view taken along a line I-I' of FIG. 3A. FIG. 4A is a perspective view illustrating a semiconductor module according to an exemplary embodiment of the inventive concept, and FIG. 4B is a cross section view taken along a line II-IF of FIG. 4A.

Referring to FIGS. 3A and 3B, a semiconductor module according to an exemplary embodiment of the inventive concept may include a flexible panel 10. The flexible panel 10 may have, for example, better flexibility than a silicon substrate or a glass substrate having the same thickness as the flexible panel 10. According to an embodiment, the flexible panel 10 may be, for example, a plastic substrate. For example, the flexible panel 10 may include one of polycarbonate (PC), polyimide (PI), polyethylene terephthalate (PET), polyester (PES), or a combination thereof.

Although not shown, the flexible panel 10 may include, for example, an electronic circuit.

The semiconductor module may further include a semiconductor chip 100a bonded to the flexible panel 10. The semiconductor chip 100a may include, for example, an integrated circuit. For example, the semiconductor chip 100a may include a drive integrated circuit. In an embodiment, the integrated circuit in the semiconductor chip 110a may be electrically connected to the electronic circuit in the flexible panel 10.

In an embodiment, the semiconductor chip 100a may have, for example, better flexibility than that of a silicon substrate being three times thicker than the semiconductor chip 100a. In more detail, when the flexible panel 10 is bent by an external force, a predetermined stress may be applied to the semiconductor chip 100a depending on the deflection of the flexible panel 10. For example, the degree of stress-resistance which the semiconductor chip 100a can withstand without breaking may be greater than that of the stress-resistance which the silicon substrate being three times thicker than semiconductor chip 100a can withstand.

In an embodiment, a stress-resistance value of the semiconductor chip 100a may be, for example, no less than about 350 Mpa. Also, the deflection value of the semiconductor chip 100a may be, for example, no less than about 0.15 mm. For example, the thickness of the semiconductor chip 100a may have a range of about 30 μm to about 50 μm.

According to an embodiment, the semiconductor chip 100a may further include, for example, a bump 120 which is electrically connected to the integrated circuit in the semiconductor chip 100. The integrated circuit of the semiconductor chip 100a may be electrically connected to the electronic circuit of the flexible panel 10 through the bump 120. In an embodiment, the bump 120 may be provided in a plural number in the semiconductor chip 100a. In this case, the bumps 120 may be, for example, two-dimensionally arranged along rows and columns. The bump 120 may include, for example, metal. For example, the bump 120 may include copper, nickel, and/or gold.

According to an embodiment of the inventive concept, the semiconductor chip 100a may be, for example, bonded directly to the flexible panel 10. That is, another structure for connection of the semiconductor chip 100a and the flexible panel 10 may be omitted. Thus, a semiconductor module optimized for being small in size and/or lightweight may be realized, and/or a semiconductor module may be formed with low manufacturing costs.

As illustrated in FIGS. 4A and 4B, the semiconductor module according to an exemplary embodiment of the inventive concept may further include, for example, a high polymer material pattern 210a disposed on the semiconductor chip 100a. The high polymer material pattern 210a may include, for example, a material having an adhesive property. For example, the high polymer material pattern 210a may include one of an epoxy adhesive, an acrylic adhesive, a polyimide adhesive, silicon adhesive or a combination thereof. In an embodiment, a hardness of the high polymer material pattern 210a may be changed by an ultraviolet irradiation process and/or a thermal treatment process. For example, when the ultraviolet irradiation process and/or the thermal treatment process is performed on the high polymer material pattern 210a, the hardness of the high polymer material pattern 210a may become less. In an embodiment, the hardness of the high polymer material pattern 210a may be, for example, less than that of the flexible panel 10.

The high polymer material pattern 210a may protect the semiconductor chip 100a to minimize damage to the semiconductor chip 100a which may be caused by an external force and/or permeation of an external material.

In the present embodiment, because the high polymer material pattern 210a may be disposed on the semiconductor chip 100a, damage to the semiconductor chip 100a which may be caused by an external force and/or permeation of an external material may be minimized. Thus, a semiconductor module with increased reliability may be realized.

Figure 5A:
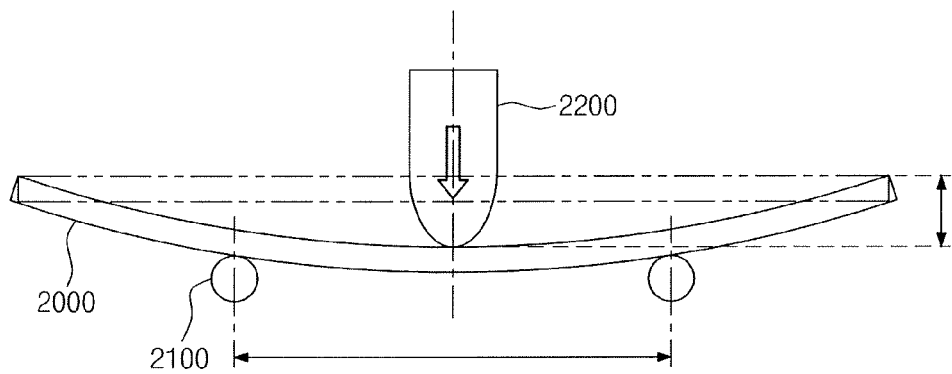
FIG. 5A is a view illustrating an experiment method to measure physical characteristics of a semiconductor chip included in a semiconductor module according to an exemplary embodiment of the inventive concept.
Figure 5B:
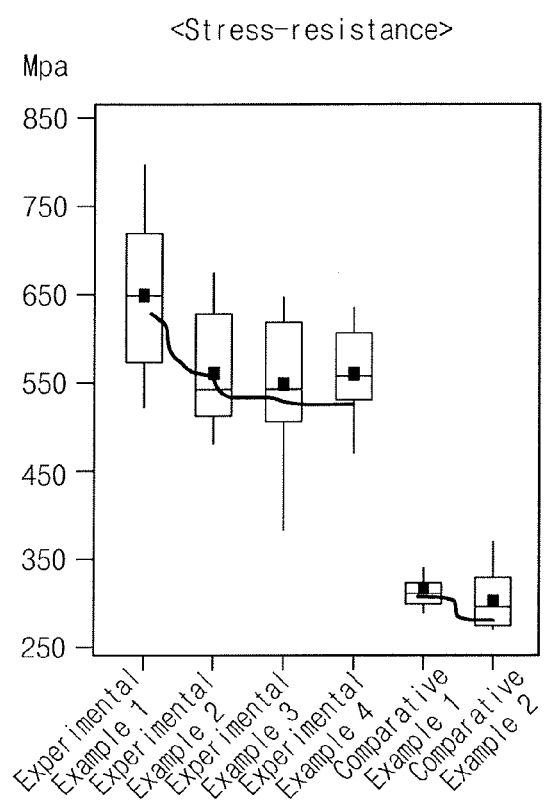
FIG. 5B is a graph illustrating stress-resistance of semiconductor chips measured by the experimental method of FIG. 5A.
Figure 5C:
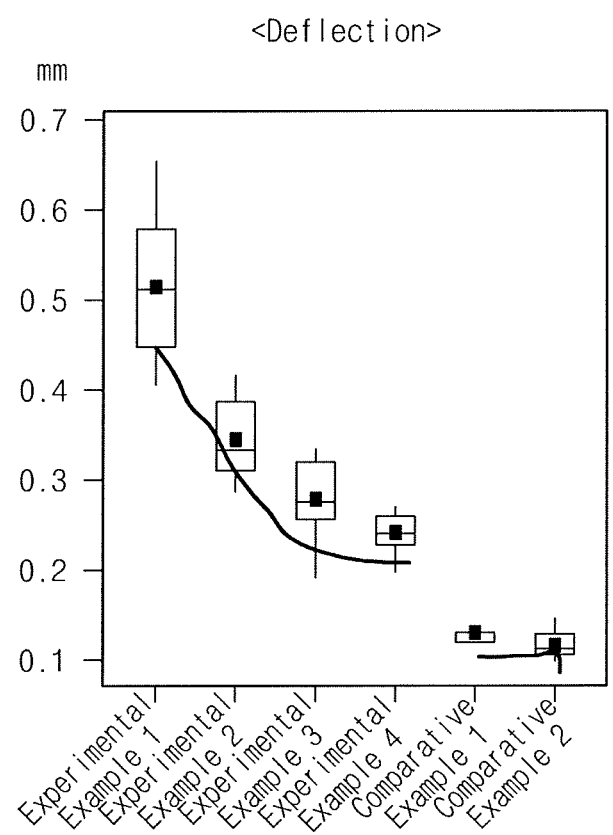
FIG. 5C is a graph illustrating deflection of the semiconductor chips measured by the experimental method of FIG. 5A.

An experiment to measure physical characteristics of the semiconductor chip 100a according to an exemplary embodiment of the inventive concept is performed using a method illustrated in FIG. 5A. Hereinafter, the physical characteristics of the semiconductor chip 100a will be described with reference to FIGS. 5A to 5C in more detail. FIG. 5A is a view illustrating an experiment method to measure physical characteristics of a semiconductor chip included in a semiconductor module according to an exemplary embodiment of the inventive concept. FIG. 5B is a graph illustrating stress-resistance of semiconductor chips measured by the experimental method of FIG. 5A, and FIG. 5C is a graph illustrating deflection of the semiconductor chips measured by the experimental method of FIG. 5A.

Referring to FIG. 5A, a semiconductor chip 2000 is placed on a pair of supporting portions 2100. The pair of supporting portions 2100 may be spaced apart from each other in one direction by a distance $W_1$. A load 2200 may be mounted over the semiconductor chip 2000 being placed on the pair of supporting portions 2100. When a predetermined pressure is applied to the semiconductor chip 2000 being placed on the pair of supporting portions 2100 using the mounted load 2200, the semiconductor chip 2000 is bent. The deflection $W_2$ of the semiconductor chip 2000 is a maximum distance between one surface of the semiconductor chip 2000 not being applied with the predetermined pressure and the one surface of the bent semiconductor chip 200 being applied with the predetermined pressured. The load 2200 may include a surface having a predetermined radius of curvature. The surface having the predetermined radius of curvature is in contact with the semiconductor chip 2000.

In the present experiment, the semiconductor chips used in experimental examples 1 to 4 and comparative examples 1 and 2 had the same widths as each other and had different thicknesses from each other. The thicknesses of the semiconductor chips used in the experimental examples 1 to 4 and the comparative examples 1 and 2 are shown in the following table 1. The semiconductor chips used in the experimental examples 1 to 4 were the semiconductor chips used in the semiconductor modules according to an exemplary embodiment of the inventive concept. The experimental examples 1 to 4 show the physical characteristics of the semiconductor chips used in the semiconductor modules according to an exemplary embodiment of the inventive concept.

TABLE 1

| | Experimental example 1 | Experimental example 2 | Experimental example 3 | Experimental example 4 | Comparative example 1 | Comparative example 2 |
|---|---|---|---|---|---|---|
| Thickness | Less than 100 μm | 150 μm | 200 μm | 250 μm | 300 μm | 400 μm |

The stress-resistance of the semiconductor chips of the experimental examples 1 to 4 and the comparative examples 1 and 2 were tested. In the present experiment, the distance $W_1$ between the pair of supporting portions 2100 was about 10 mm. And the load 2200 including the surface having a radius of curvature of no greater than about 3 mm was used in the present experiment. A pressure with a speed of about 1 mm/minute was applied to the semiconductor chips using the load.

When the semiconductor chips of the experimental examples 1 to 4 and the comparative examples 1 and 2 were broken, forces F of the applied pressures were measured. The stress-resistances of the semiconductor chips were calculated by the following formula using the measured forces F. The calculated stress-resistances were illustrated in FIG. 5B.

$$S(\text{stress-resistance}) = 3F \times W_1 / 2L \times d^2 \quad \text{[Formula]}$$

Wherein F is the force (N) at break of the semiconductor chip, $W_1$ is the distance (about 10 mm) between the pair of supporting portions 2100, L is the width (mm) of the semiconductor chip, and d is the thickness (mm) of the semiconductor chip.

Referring to FIG. 5B, the semiconductor chips of the experimental examples 1 to 4 have stress-resistance values greater than about 350 Mpa. Alternatively, the semiconductor chips of the comparative examples 1 and 2 have stress-resistance values less than about 350 Mpa. With embodiments of the inventive concept, when the semiconductor chip is bonded directly to the flexible panel, a predetermined stress may be applied to the bonded semiconductor chip by bending phenomenon of the flexible panel. When the bonded semiconductor chip has the stress-resistance value less than about 350 Mpa, the semiconductor chip may be broken due to the stress applied by the bending phenomenon of the flexible panel. Thus, the semiconductor chip bonded directly to the flexible panel has a stress-resistance value of no less than about 350 Mpa. That is, the semiconductor chip 100a in the semiconductor module according to an embodiment of the inventive concept may have a stress-resistance value of no less than about 350 Mpa. For example, the semiconductor chip 100a in the semiconductor module according to an embodiment of the inventive concept may have a stress-resistance value of no less than about 550 Mpa.

Also, deflection values of the semiconductor chips of the experimental examples 1 to 4 and the comparative examples 1 and 2 were measured just before the semiconductor chips are broken. The measured deflection values were illustrated in FIG. 5C.

Referring to FIG. 5C, the deflection values $W_2$ of the semiconductor chips of the experimental examples 1 to 4 are greater than about 0.15 mm. Alternatively, the deflection values $W_2$ of the semiconductor chips of the comparative examples 1 and 2 are less than about 0.15 mm. In an embodiment of the inventive concept, when the semiconductor chip is bonded directly to the flexible panel, the bonded semiconductor chip can be bent by the bending phenomenon of the flexible panel. In this case, if the deflection value of the bonded semiconductor chip is small, the semiconductor chip may be broken by the bending phenomenon of the flexible panel. Thus, the deflection value $W_2$ of the semiconductor chip 100 in the semiconductor module according to an embodiment of the inventive concept may be no less than about 0.15 mm. For example, the deflection value $W_2$ of the semiconductor chip 100 in the semiconductor module according to an embodiment of the inventive concept may be no less than about 0.4 mm.

Figure 6:
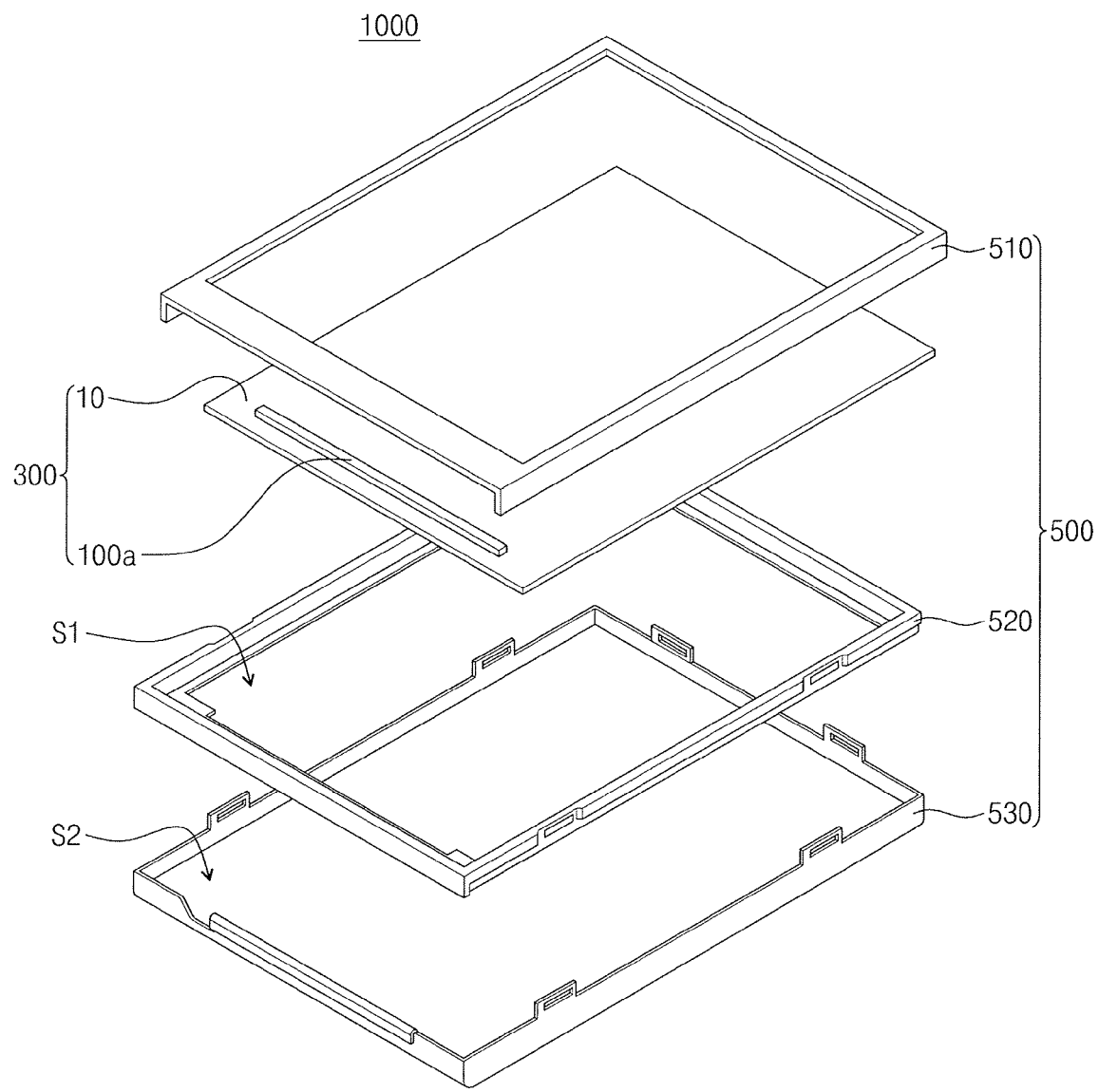
FIG. 6 is an exploded perspective view a display apparatus including a semiconductor module according to an exemplary embodiment of inventive concept.

A semiconductor module according to an exemplary embodiment of the inventive concept may be applied to various electronic apparatus. A display apparatus including the semiconductor module according to an exemplary embodiment of the inventive concept will be described with reference to FIGS. 6 and 7, hereinafter. FIG. 6 is an exploded perspective view of a display apparatus 1000 including a semiconductor module according to an exemplary embodiment of inventive concept, and FIG. 7 is a partial enlarged cross sectional view illustrating the inside of a flexible panel included in the display apparatus 1000 of FIG. 6.

Figure 7:
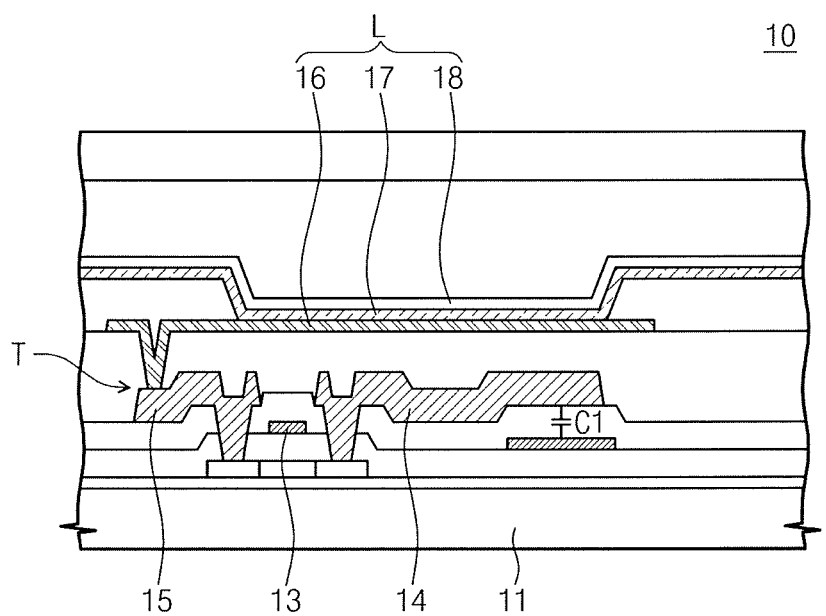
FIG. 7 is a partial enlarged view illustrating the inside of a flexible panel included in the display apparatus of FIG. 6.

Referring to FIGS. 6 and 7, the display apparatus 1000 may include, for example, a display unit 300 and a container unit 500. In an embodiment, the display unit 300 may be, for example, one of the semiconductor modules according to an exemplary embodiment of the inventive concept.

The display unit 300 may include, for example, the flexible panel 10 and the semiconductor chip 100a. The flexible panel 10 may include, for example, a display region and a peripheral region. The display region may display an image corresponding to an inputted electrical signal, and the peripheral region may be disposed on a periphery of the display region. The display region of the flexible panel 10 may include, for example, a plurality of pixels arranged in a matrix shape. As illustrated in FIG. 7, each of the pixels may include, for example, an organic electro luminescent device L, a thin film transistor T, and a storage capacitor C1. The thin film transistor T may include, for example, a gate electrode 13, a source electrode 14, and a drain electrode 15. Also, the organic electro luminescent device L may include, for example, an anode electrode 16, an organic light emitting layer 17, and a cathode electrode 18. The anode electrode 16 of the organic electro luminescent device L may be connected to the drain electrode 15 of the thin film transistor T.

The storage capacitor C1 may be connected to the thin film transistor T to provide an output current in proportion to the square of a difference between a stored voltage in the storage capacitor C1 and a threshold voltage to the organic electro luminescent device L. The organic electro luminescent device L may emit light by the output current.

The semiconductor chip 100a may be mounted on the peripheral region of the flexible panel 10. In an embodiment, the semiconductor chip 100a may provide a drive signal to the pixels in the display region of the flexible panel 10. In an embodiment, the semiconductor chip 100a may have, for example, better flexibility than that of a silicon substrate being three times thicker than the semiconductor chip 100a. In an embodiment, the stress-resistance value of the semiconductor chip 100a may be, for example, no less than about 350 Mpa. Also, in an embodiment, the deflection value of the semiconductor chip 100a may be, for example, no less than about 1.5 mm. For example, a thickness of the semiconductor chip 100a may have a range of, for example, about 30 μm to about 50 μm.

As illustrated in FIGS. 4A and 4B, the display unit 300 may further include, for example, a high polymer material pattern 210a disposed on the semiconductor chip 100a. The high polymer material pattern 210a may protect the semiconductor chip 100a to minimize damage to the semiconductor chip 100a which may be caused by an external force and/or permeation of an external material.

The container unit 500 of the display apparatus 1000 may include, for example, a top chassis 510, a mold frame 520, and a bottom chassis 530. The mold frame 520 may contain the display unit 300 within the first containing space S1 of the mold frame 520. The mold frame 520 may include, for example, a bottom surface, and a side surface being extended from an edge of the bottom surface for formation of the first containing space S1. The mold frame 520 may be made of, for example, a synthetic resin material.

The mold frame 520 may be contained in the second containing space S2 of the bottom chassis 530. The bottom chassis 530 is made of, for example, a metal material. The bottom chassis 530 may include, for example, a bottom plate, and a side plate being extended from an edge of the bottom plate for formation of the second containing space S2. The top chassis 510 may fix the mold frame 520 and the display unit 300 housed within the first containing space S1 of the mold frame 520 within the second containing space S2 of the bottom chassis 530.

The semiconductor chip 100a may be, for example, directly mounted on the peripheral region of the flexible panel 10 in the display unit 300 of the display apparatus 1000 described above. Thus, another structure for connection of the semiconductor chip 100a and the flexible panel 10 may be omitted. As a result, a semiconductor module optimized for being small in size and/or lightweight may be realized. Also, damage to the semiconductor chip 100a which may be caused by an external force and/or permeation of an external material may be minimized due to the high polymer material pattern 210a. Thus, a display apparatus 1000 with increased reliability may be realized.

According to an exemplary embodiment of the inventive concept, the semiconductor chip may be adhered to the support substrate, and then the adhered semiconductor chip may be bonded to the flexible panel. Thus, the semiconductor chip may be bonded to the flexible panel in a state in which damage to the semiconductor chip can be minimized. As a result, a semiconductor chip with increased reliability may be realized.

Also, the semiconductor chip may be bonded directly to the flexible panel. Thus, a semiconductor module optimized for being small in size and/or lightweight may be realized, and/or a semiconductor module may be formed with low manufacturing costs.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A method of forming a semiconductor module, comprising:
    forming a high polymer material layer having an adhesive property on a support substrate;
    adhering a plurality of semiconductor chips to the support substrate using the high polymer material layer;
    cutting the support structure substrate and the high polymer material layer to separate the plurality of semiconductor chips from each other;
    bonding the semiconductor chip adhered to the support substrate to a flexible panel; and
    removing the support substrate.

2. The method of claim 1, wherein a stress-resistance value of the plurality of semiconductor chips is no less than about 350 Mpa.

3. The method of claim 1, wherein the adhering of the plurality of semiconductor chips to the support substrate comprises:
    adhering a wafer including the plurality of semiconductor chips and a scribe lane to the support substrate; and
    dicing the scribe lane.

4. The method of claim 1, wherein the removing of the support substrate comprises: performing an ultraviolet irradiation process, a thermal treatment process or an ultraviolet irradiation process and a thermal treatment process on the high polymer material layer.

5. The method of claim 4, wherein a hardness of the high polymer material layer is less than a hardness of the flexible panel due to the ultraviolet irradiation process, the thermal treatment process, or the ultraviolet irradiation process and the thermal treatment process.

6. The method of claim 1, further comprising: removing the high polymer material layer.

7. The method of claim 6, wherein the high polymer material layer and the support substrates are removed simultaneously by the same process.

8. The method of claim 1, wherein the plurality of semiconductor chips adhered to the support substrate is bonded directly to the flexible panel.

9. The method of claim 1, wherein the support substrate is removed from the high polymer material layer while the high polymer material layer remains adhered to the semiconductor chip that is bonded to the flexible panel.

10. The method of claim 9, further comprising: removing the high polymer material layer from the semiconductor chip after the support substrate has been removed from the high polymer material layer.

* * * * *